United States Patent [19]

Baumberger et al.

[11] Patent Number: 4,476,158
[45] Date of Patent: Oct. 9, 1984

[54] METHOD OF DEPOSITING A MINERAL OXIDE COATING ON A SUBSTRATE

[75] Inventors: Otto Baumberger, Carouge; Reinhard Kalbskopf, Vordenwald, both of Switzerland

[73] Assignee: Battelle Memorial Institute, Carouge, Switzerland

[21] Appl. No.: 440,225
[22] PCT Filed: Mar. 4, 1982
[86] PCT No.: PCT/CH82/00032
   § 371 Date: Nov. 3, 1982
   § 102(e) Date: Nov. 3, 1982
[87] PCT Pub. No.: WO82/03093
   PCT Pub. Date: Sep. 16, 1982

[30] Foreign Application Priority Data

Mar. 6, 1981 [CH] Switzerland ............ 1520/81

[51] Int. Cl.³ .................. B05D 5/06; B05D 5/12
[52] U.S. Cl. .................... 427/109; 427/166; 427/167; 427/255; 427/255.2; 427/255.3; 118/315
[58] Field of Search ........... 427/109, 166, 167, 255, 427/255.2, 255.3; 118/315

[56] References Cited

U.S. PATENT DOCUMENTS 3,511,703  5/1970  Peterson .............. 427/255 X
3,524,590  8/1970  Myskowski ............ 239/424.5

FOREIGN PATENT DOCUMENTS 926438  10/1947  France .
1089640  3/1955  France .
1518843  3/1968  France .
2348165  11/1977  France .
107723  11/1977  German Democratic Rep. .

Primary Examiner—Michael R. Lusignan
Attorney, Agent, or Firm—Karl F. Ross; Herbert Dubno

[57] ABSTRACT

Reactive gases providing a coating on a substrate by CVD are made to meet in counterflow, in order to ensure, by the turbulence effect, that there is an almost instantaneous mixing of the said reagents. The movement of the gases before contact is ensured by two pipes containing baffles, the effect of which is to cause the gases to rotate in opposite directions to one another. Application to the coating of glass with transparent conductive $SnO_2$.

6 Claims, 7 Drawing Figures

METHOD OF DEPOSITING A MINERAL OXIDE COATING ON A SUBSTRATE

CROSS REFERENCE TO RELATED APPLICATION

This application is a National Phase application corresponding to PCT/CH No. 82/00032 filed Mar. 4, 1982 under the Patent Cooperation Treaty and based, in turn, upon a Swiss National application No. 1520/81 filed Mar. 6, 1981 under the International Convention and the priority of which is claimed.

FIELD OF THE INVENTION

The present invention relates to a method of coating at least part of a substrate with a layer of a mineral substance; it likewise relates to a device for performing this method.

BACKGROUND OF THE INVENTION

The present method is based on the so-called CVD (chemical vapor deposition) technique which consists of directing gaseous blasts of one or more reagents onto a substrate which has been brought to a high temperature, these gaseous blasts uniting on the substrate or in the immediate vicinity thereof and depositing thereon a solid product, in the form of a coating which is uniform to a greater or lesser extent and results from a decomposition or chemical reaction of the said reagents. In usual practice, the reactive gases are guided onto the substrate by means of blast pipes arranged such that at the point where they meet the reactive gases are mixed in non-turbulent conditions, vortex motions likely to cause a premature reaction of the reactive gases and the deposition of part of the solid product on the ends of the said blast pipes and the other parts of the coating device being avoided as far as possible. Parasitic depositions of this type foul the device and rapidly alter the operational characteristics which is extremely undesirable.

Thus, for example, the patent FR-A- No. 2.348.165 (BFG GLASS GROUP) discloses a coating device (see page 10, lines 8-31; FIG. 2) comprising two blast pipes directed at 35° maximum with respect to one another, in order that the gaseous flows emerging from these pipes mix progressively with a minimum of turbulence. In addition, for the same purpose, the gaseous blast resulting from the mixing of the above flows is directed onto the substrate to be coated at an angle which does not exceed 60°. Other details on the previous CVD coating methods and devices may be found, for example, in the following references: FR No. 2 083 818; BE No. 877 465; U.S. Pat. No. 3,850,679; FR No. 2 314 152; CH No. 7 033/79.

SUMMARY OF THE INVENTION

It has now been discovered that, on the contrary, it is advantageous in a method for forming a metal oxide coating by CVD to cause at the point of contact a mixing which is as instantaneous as possible of the reagents in the vapor stage, by causing a maximum amount of turbulence and vortical effect of the gaseous flows. It has been noted that deposits formed under such conditions are very uniform and homogeneous, the grains of the deposits are very fine and, in every case, have smaller dimensions than the wave lengths of visible light which eliminates errors due to diffraction. This may be most simply achieved either by causing the said gaseous flows to meet at an angle very different from zero degrees, or by moving them at very different speeds, or by combining these two effects.

What is to be understood by the angle at which the gaseous flows meet is the angle which the displacement vectors of the reagent currents in the vapor phase form with respect to one another at the point of impact. In the invention, this angle is to be at least 35° and preferably between 60° and 180°. What is understood by very different speeds is that one of the gaseous flows moves at least 1.5 to 2 times faster than the other, it being possible for the difference between the two to be much greater, for example 10:1 or even 20:1. Of course, these considerations are equally valid if there are more than two gaseous flows, i.e., for example, if the reaction requires three (or more) independent gaseous reagents or if, in the case of two reagents, these are conveyed to the point of contact by more than two pipes. In a case of this type it is sufficient (but this is not compulsory) for only two of the gaseous blasts to comply with the above-mentioned conditions. It is likewise understood that in all cases the reactive stoichiometry of the constituents is taken into account such that, for example in the case of a reaction requiring volumes of the reagents which are originally equal the fastest current will be diluted to a greater degree (for example by means of a carrier gas) than the slowest current, precisely as a function of the differences in speed. Or the aperture of the blast pipes conveying the gases may be adapted accordingly, the aperture of the pipe corresponding to the fastest flow being narrower than that of the pipe corresponding to the slowest flow.

In the present invention it is preferred to concentrate on the angle factor which is preferably approximately 90° to 180° which means, in other words, that it is preferable for the gaseous flows to meet either at a right angle or in counter-flow. With respect to the prior art, attention will be paid to the existence of the following document, DD-A-No. 107,723 (PETERMANN) which discloses a CVD coating method according to which the gaseous mixture is projected at a right angle onto the substrate. In this method, before being directed onto the substrate, the reactive gas is introduced into a reaction chamber where it is subjected to an intense turbulent motion and where it is conveyed onto the substrate in the form of a uniform turbulence front.

An embodiment of the device for performing the above method (see FIG. 4 and page 12) comprises two turbulence chambers located adjacent one another, the outlet apertures of which direct the reactive gases onto the substrate to be coated according to two vortical blasts directed parallel to one another, these blasts mixing in an intense manner during their passage between these apertures and the said substrate. However, this document does not disclose means enabling these gaseous blasts to be directed against one another at an angle greater than 35°, or means for initially moving these gas blasts at different speeds, so as to complete the mixing effect due to the turbulence obtained previously. In addition, it states in this publication that the turbulence is either imparted to the blast of gases which have already been mixed or independently to each of the gaseous currents, whereas in the invention it is the impact between these blasts which causes the turbulence.

The invention is illustrated by the attached drawing which shows a device for performing the method according to the invention. This device is for coating a "float" glass sheet with a uniform layer of $SnO_2$ which is transparent, electrically conductive and very finely grained, the structural elements thereof being in particular designed so as to minimize fouling of the elements for spraying the $SnO_2$ coating. It is, however, understood that the invention may equally be suitable for depositing other mineral coatings, for example layers of $TiO_2$, $SiO_2$, Si (by decomposition, for example of $SiH_4$), $In_2O_3$, $ZrO_2$, $Cr_2O_3$, $Fe_2O_3$ and NiO, as well as mixtures thereof.

SPECIFIC DESCRIPTION

Figure 1:
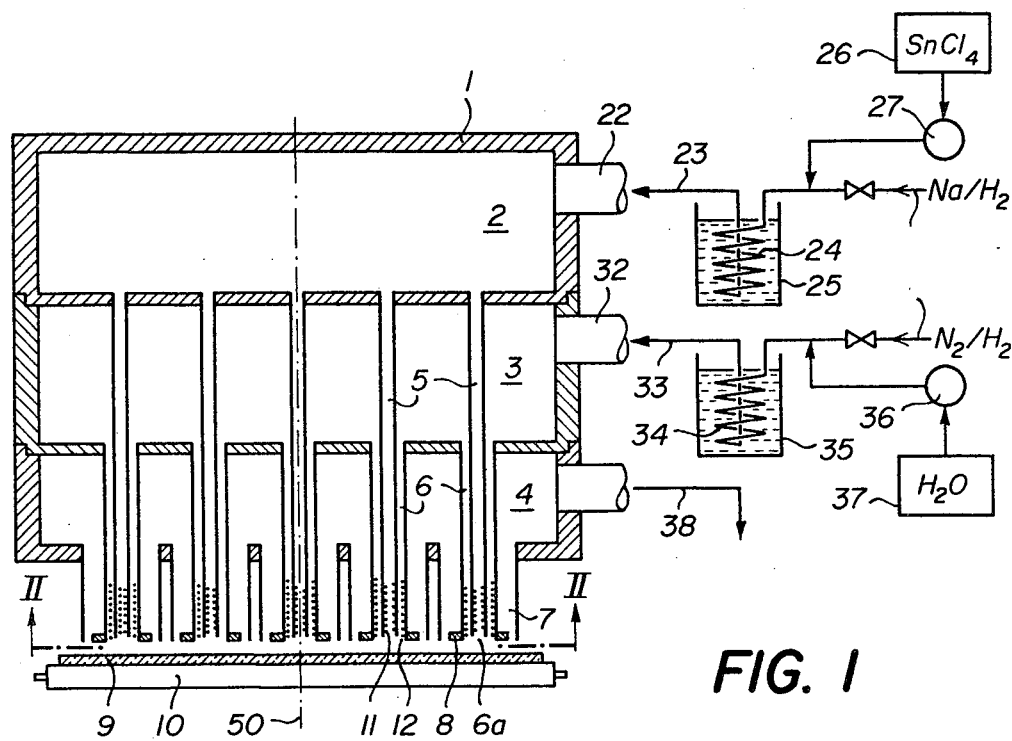
FIG. 1 shows a profile view of a diagrammatic fragmentary section of a device with a plurality of spray nozzles.
Figure 2:
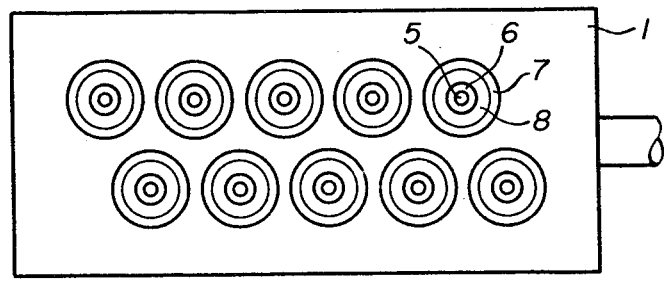
FIG. 2 shows a diagrammatic plan view of the nozzles along the line II—II of FIG. 1.
Figure 3:
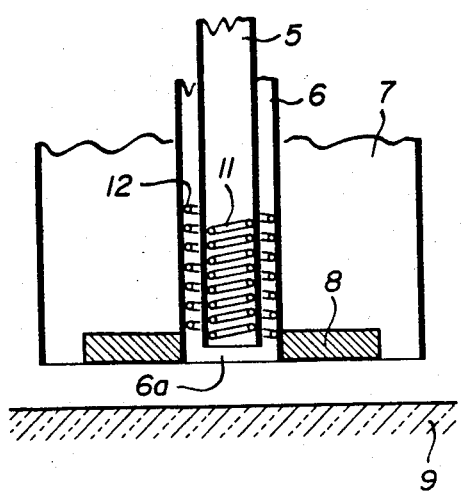
FIG. 3 shows an enlarged diagrammatic section of one of the nozzles of the device of FIG. 1.

The device disclosed here by way of example and illustrated by FIGS. 1, 2 and 3 comprises a housing 1 containing two reactive gas supply chambers, 2 and 3, respectively for $SnCl_4$ and water (which may possibly contain other additives, for example HF), and an evacuation chamber 4 for the gases produced by the reaction. The housing is equipped with two series of identical nozzles disposed in a staggered arrangement (cf. FIG. 2), each of these nozzles comprising the following elements: a central conduit 5 connected to the chamber 2, a coaxial pipe 6 connected to the chamber 3 and an outer suction chamber or piping 7 communicating with the evacuation chamber 4. In order to enable the reagents to mix with one another in the mouth 6a of the nozzle, the conduit 5 terminates some distance behind the aperture of the pipe 6 which comprises a deflector 8 designed to cause the reaction gases emerging from the nozzle aperture to spread out between the deflector and the glass sheet 9 to be coated, such that the zone of the said sheet located directly opposite the said deflector 8 is coated in a uniform manner by the solid reaction product, in this case $SnO_2$. The float glass sheet 9 itself rests on the rollers 10 which convey it in horizontal translation with respect to the nozzles and perpendicular to the plane of the drawing in FIG. 1, in such a way that the coating is deposited progressively and uniformly on the glass sheet. The conduit 5 contains a helical baffle, in this case a coil spring 11, the presence of which forces the descending blast of gas in the conduit 5 to perform a clockwise rotational movement. Similarly, the coaxial pipe 6 comprises a spring 12 imparting a laevorotatory movement to the gases passing therethrough. The gases emerging from the apertures of the pipes 5 and 6 uniting with one another in the mouth 6a of the nozzle therefore meet approximately in counter-flow (the angle at which they meet being approximately 180°) which ensures an almost instantaneous mixing of the reagents. It is understood that the springs 11 and 12 could be replaced by any other means for the rotational movement of the gases, for example ribs.

Moreover, as regards the springs 11 and 12, it is noted that they may have the same degree of chirality but a different pitch, such that the gases emerging from the pipes meet at an angle of less than 90°.

In addition, the device illustrated in the drawing comprises a controlled supply system for the reagents formed by the following members: a conduit 22 for entry into the chamber 2 connected, as shown schematically by the arrowed line 23, to an evaporator 24 in the form of a coil immersed in a liquid 25 heated to a temperature suitable for ensuring the evaporation of the $SnCl_4$. This reagent contained in a tank 26 is injected in a measured quantity by a metering pump 27 upstream of the evaporator 24 into the supply conduit 23. It should be noted that it is also possible to introduce (but in an optional manner) a carrier gas into the line 23 as shown in the drawing. This carrier gas, for example a mixture of $N_2$ and $H_2$, enables the $SnCl_4$ vapor to be diluted to a greater or lesser extent and enables its flow in the nozzles of the present device to be controlled efficiently.

Figure 4:
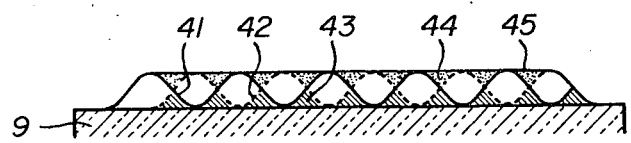
FIG. 4 shows a diagrammatic representation of the deposit patterns provided by the device of FIG. 1.

As shown in the drawing, the device comprises a water supply which is exactly the same as the $SnCl_4$ supply, this water supply comprising the inlet conduit 32, the supply line 33, the evaporator 34 heated by the liquid 35 and the metering pump 36 enabling the flow of water from the tank 37 to be measured exactly. In addition, the evacuation chamber 4 is connected by a suction conduit shown by the arrow 38 to a conventional suction and gas cleansing system, not shown here. It should also be noted that the chambers 2 and 3 contain a baffle system (known per se and not shown in the drawing) for distributing the pressure and flow of the gases uniformly in each nozzle of the present device. In this respect, it can be seen from the drawing that the two rows of five nozzles of the device are staggered, the object of the arrangement being that the deposits from the nozzles of the second row are intercalated on the glass, between the deposits formed by the nozzles of the first row. The result of this arrangement is shown diagrammatically in FIG. 4 in which a first sinusoid 41 represents the profile of the pattern (this is, however, theoretical since this profile actually adopts the form of a series of slits) formed by the deposit from the first row of nozzles and a second sinusoid 42 represents the profile of the pattern of the deposit of the second row of nozzles. The shaded areas 43 represent the sum (by integration) of the deposits on the zones common to the two sinusoidal series of deposits and clearly, as a physical entity, this sum corresponds to the dotted area 44, which fills the "empty spaces" between the crests of the sinusoids 41 and 42. Thus the shape of the final deposit corresponds to the outer curve 45, which shows that the total deposit obtained by the present device is uniform and has an almost constant thickness. It is also possible, if it is desired, to vary the degree of encroachment of one of the sets of patterns on the other and if the operational spread of the set of nozzles is sufficient with respect to the width of the glass plate, to slightly pivot the coating device about an imaginary vertical axis 50, in such a way that the patterns of one of the rows of nozzles is laterally staggered with respect to the other.

It is also noted that, although the present device has been limited to two rows of five nozzles, a greater number of these rows may also be easily provided, for example 3, 4, 5 or more, in order to reinforce the thickness of the total deposit, and any number of nozzles in one row.

Figure 5:
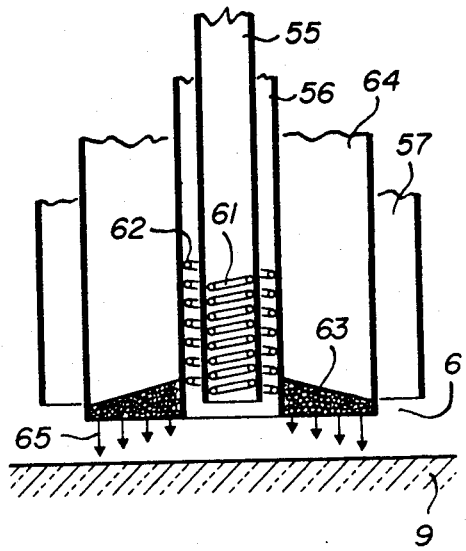
FIG. 5 is an enlarged diagrammatic section of a variant of a spray nozzle.

FIG. 5 shows a first variant of the nozzle according to the invention. As is the case with the nozzle of FIG. 3, this variant comprises a central pipe 55, a coaxial pipe 56, a suction chamber 57 and deflector springs 61 and 62. The deflectors 8 of the nozzle in FIG. 3 are, on the other hand, replaced in the present variant by an annular plug 63 made from a porous material, for example a ceramic material or a sintered metal (Cu, Ni, Fe, etc.), housed at the end of an intermediate coaxial piping 64 connected to an additional gas supply chamber, not shown in the drawing. The frustoconical form of the plug enables the flow of a gas (a carrier gas) admitted by the piping 64 and passing through this plug to spread out as a function of the resistance formed by the porous material of this plug: weaker towards the exterior than towards the center. In this way the dispersion conditions for the reaction gases being discharged from the nozzles may thus be controlled very efficiently, the carrier gas from the pipe 64 acting as an air cushion, the distribution of which (see the arrows 65 in the drawing) acts upon the distribution of the gaseous reactive medium between the outlet of the nozzle, the glass sheet and the suction chamber 57. This variant also enables the uniformity and homogeneity of the coating layer to be improved.

Figure 6:
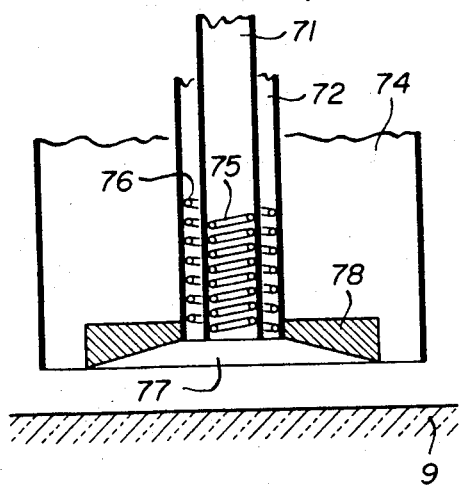
FIG. 6 is a second variant of a nozzle.

FIG. 6 shows schematically the end of a second variant of a nozzle. As in the cases already described, it comprises a central pipe 71, a coaxial pipe 72, a suction chamber 74 and springs 75 and 76 which rotate the flows descending the pipes 71 and 72 in opposite directions. However, contrary to the nozzle in FIG. 3, the apertures of the two pipes are at the same level and open into a frusto-conical reaction zone 77, the oblique walls of which are formed by an annular deflector 78, the lower face of which is bevelled as shown in the drawing. The special form of the zone 77 results in a regularization of the radial movement of the gases from the nozzle in the direction of the suction chamber 74, which phenomenon assists in ensuring a uniform deposit on the sheet 9.

Figure 7:
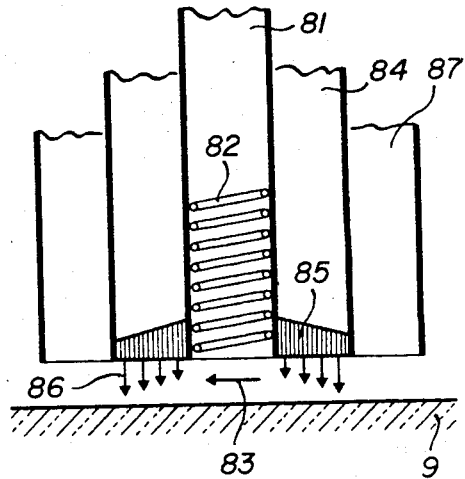
FIG. 7 is a third variant of a spray nozzle.

FIG. 7 shows the lower end of a third variant of the nozzle. The latter comprises a central pipe 81 equipped with a helical baffle 82 providing the gases descending in this pipe with a clockwise rotational movement indicated by the arrow 83. The nozzle also comprises a coaxial pipe 84, the end of which is provided with a frustoconical plug 85 made of a gas-permeable material. This material may be a ceramic material, a sintered metal or a piece of corrugated sheet metal, for example copper, rolled up on itself so as to form a resistance for the passage of the gas flowing through the pipe 84, this resistance being used to regulate and distribute the gases from the said pipe over a radial plane. The plug 85 may also be formed by metal bristles (gas-permeable brush) set between the walls of the pipes in a manner known per se, for example by an annular boss not shown in the drawing of the walls of the pipe 84. The material of the plug (ceramic, rolled sheet, metal bristles or glass fibers etc,) should obviously not be capable of being attacked by the superheated water vapor; glass fiber, copper, nickel, bronze and stainless steel are suitable for this use.

The water vapor which is pure or mixed with the inert carrier gas emerges vertically from the pipe 84 (see arrows 86) and meets the rotating gas emerging from the pipe 81 in an approximately perpendicular manner. In this case the reagent flows meet at an angle of approximately 90°.

It is also noted that with the plug 85 described here, the total flow of gas is approximately 3 to 4 times slower in the outer pipe 84 than in the central pipe 81. Consequently, when gas currents (for example SnCl$_4$ and H$_2$O) are used in substantially equal volumes, that is 1 mol SnCl$_4$ diluted in 1 volume of carrier gas to two volumes water vapour, the pipe 84 is provided with an aperture, the useful section of which is approximately 3 to 4 times that of the central pipe. In other words, if the central pipe has an internal diameter of 4 mm, that is a cross-section of approximately 12 mm$^2$, the outer coaxial pipe will have an approximate diameter of 8 mm, that is a useful section of $48-12=36$ mm$^2$, the thickness of the walls being negligible.

Of course, alternatively, the porosity of the plug 85 may be altered such that the total flow of the pipe 84 is double, for example, that of the pipe 81, which than enables 1 volume of pure SnCl$_4$ vapor (1 mol) to be passed simultaneously into the nozzle, via the central pipe, for two volumes of undiluted water vapor, via the pipe 84, according to the formula:

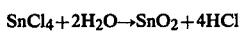

$$SnCl_4 + 2H_2O \rightarrow SnO_2 + 4HCl$$

All modifications of this type within the scope of the person skilled in the art by simple variations of the dimensions of the nozzles and the operational parameters are also included in the invention.

The operation of the present invention follows from the preceding description. The glass sheet formed by a continuous strip of float glass, travels at a suitable speed, for example, of the order of 5 to 25 m/min, driven by the rollers 10 and its temperature at the outlet of the "float" furnace is of the order of 450°–600° C. This strip of glass travels at a distance of the order of 1 to 5 mm from the outlet of the nozzles of the present device. At the same time quantities of SnCl$_4$ and water vapour are sent by the set of metering pumps 27 and 36 and the evaporators 24 and 34 through the pipes 5 and 6 respectively, such that the reagents are mixed in counterflow at the mouth of the nozzles and the reaction product is deposited on the moving sheet. In order to achieve a sufficient evaporation of the SnCl$_4$ and the water in the evaporators, in the absence or presence of a carrier gas, the latter are heated for example by an oil or polyalcoylene glycol bath between approximately 120° and 200° C., 150° being an advantageous average. In addition, so as to avoid condensation of the reagents in the supply chambers or in the nozzles, all these members are likewise maintained at an adequate temperature (120°–200°), the heating being ensured either by conventional means which are not shown (electric heater, for example) or by direct radiation of the float glass strip.

As regards the flow at a rate of movement of 5 m/min, using nozzles having an overall width of 15 mm with a tube 5 of 1.8–2 mm, a tube 6 of 2.8 to 3 mm and a deflector of 8 to 10 mm and with 2000 nozzles per row for a glass strip which is 300 cm wide and with ten rows of nozzles each staggered with respect to the others, 5 to 100 Nm$^3$ of SnCl$_4$ vapor per hour and from 10 to 200 Nm$^3$ of water vapour per hour will be used (these volumes designated Nm$^3$ (meaning m$^3$ STP) are measured at ordinary temperature and pressure) without a carrier gas. Under such conditions completely transparent and homogeneous deposits of SnO$_2$ of between 0.5 and 1.5$\mu$ thickness and resistance of R$_\square$ = 10 to 1.5$\Omega$ are obtained.

By adding a carrier gas to the reagents, for example a N$_2$/H$_2$ mixture in proportions of 20/80 to 0/100 at a rate, for example, of 1 liter (in two instances) carrier gas per liter of reagent, it is possible to achieve total rates of flow of the order of 20 Nm$^3$ to 400 Nm$^3$/h maximum.

It is noted that the pressures (and the rates of flow) of the suction are greater than the supply pressures such that the complete evacuation of the reactive gases is ensured and the fouling of the depositing members is prevented.

The following example illustrates the invention.

An apparatus according to the present description was used to coat a float glass strip, 30 cm wide and moving at a speed of 5 m/min, brought to a temperature of 600° C. with a transparent and electrically conductive layer of $SnO_2$. The device used had the following features:

Number of rows of nozzles: 10 (five double rows in staggered arrangement).

Number of nozzles per row: 20. Structural parameters of the nozzles: walls of the pipes, thickness: 0.1 mm; $\phi$ of the internal pipe 5: 1.8 mm; $\phi$ of the coaxial pipe 6: 2.8 mm; useful area of the outlet apertures of the pipes 5 and 6: 3.1 mm²; distance between the mouths of the pipes 5 and 6: 1 mm; distance between the glass of nozzles: 2 mm; $\phi$ of the deflector 8: 10 mm; diameter of the suction chamber: 14 mm; distance between the nozzles (from axis to axis): 15 mm; temperature of the casing and the nozzles: 150° C.

99.9% pure distilled $SnCl_4$ was placed in the tank 26 and bi-distilled water increased with 5% HF was placed in the tank 37. The evaporators 24 and 34 were heated to 150° by means of an electrically heated oil bath and the $SnCl_4$ was made to flow by the pump 27 at the rate of 10.6 l/h and the water was made to flow by the pump 36 at the rate of 32 l/h. 2 Nm³/h of a 60/40 $N_2/H_2$ mixture were introduced by the line 23; no carrier gas was introduced by the line 33.

A $SnO_2$ layer of 1$\mu$, the transparency of which was 80% and the resistance $R_\square$ of which was 3$\Omega$, was thus deposited on the glass band.

It was possible to operate the present apparatus for 30 minutes without observing any particular fouling of the nozzles and without the coating parameters changing significantly. After this period of time the apparatus was halted, allowed to cool and water was circulated at ambient temperature in the supply chambers and the nozzles in order to clean them by rinsing.

We claim:

1. In a method for coating a substrate with a layer of mineral material consisting of directing onto the said substrate heated to a high temperature gaseous blasts or flows of at least one reagent, the latter joining on the substrate or in the immediate vicinity of the latter and depositing thereon a product, in the form of a coating, resulting from the decomposition or reaction of said reagent, the improvement wherein the gaseous blasts are directed to meet at a point of contact by at least one of the steps:
   (a) directing them towards each other at an angle greater than 35 degrees; and
   (b) moving the gaseous blasts beforehand at different speeds so as to cause an almost instantaneous mixture of the said gaseous flows.

2. The improvement defined in claim 1 wherein the meeting angle is selected between 60 and 180 degrees.

3. The improvement defined in claim 1 wherein the relation between the speed of one of the blasts and that of at least one of the others varies between 1.5:1 to 20:1.

4. The improvement defined in claim 1 wherein two gaseous blasts with substantially equal speeds and rates of flow are used and meet in counter-flow at the point of impact.

5. The improvement defined in claim 4 wherein before the blasts meet, they are caused to move in a helical manner in opposite directions.

6. The improvement defined in claim 4 wherein one of the blasts contains $SnCl_4$ and the other contains water vapour, the reaction product being a transparent and electrically conductive deposit of $SnO_2$.

* * * * *